(12) United States Patent
Banschick et al.

(10) Patent No.: US 12,148,017 B2
(45) Date of Patent: *Nov. 19, 2024

(54) SYSTEM AND METHOD FOR PARAMETRIC DISPLAY OF MODULAR AESTHETIC DESIGNS

(71) Applicant: Florelle, Inc., New York, NY (US)

(72) Inventors: Kenneth Banschick, Port Washington, NY (US); Andrei Gurulev, Buchanan, NY (US)

(73) Assignee: Florelle, Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/967,670

(22) Filed: Oct. 17, 2022

(65) Prior Publication Data

US 2023/0044310 A1    Feb. 9, 2023

Related U.S. Application Data

(60) Continuation of application No. 16/995,796, filed on Aug. 17, 2020, now Pat. No. 11,475,497, which is a
(Continued)

(51) Int. Cl.
*G06Q 30/0601* (2023.01)
*G06F 3/0482* (2013.01)
*G06F 3/04842* (2022.01)
*G06F 3/04847* (2022.01)
*G06F 16/951* (2019.01)
(Continued)

(52) U.S. Cl.
CPC ....... *G06Q 30/0621* (2013.01); *G06F 3/0482* (2013.01); *G06F 3/04842* (2013.01); *G06F 3/04847* (2013.01); *G06F 16/951* (2019.01); *G06F 30/00* (2020.01); *G06Q 10/101* (2013.01); *G06Q 30/0625* (2013.01);
(Continued)

(58) Field of Classification Search
CPC ............. G06Q 30/0621; G06Q 10/101; G06Q 30/0625; G06Q 30/0643; G06Q 50/12; G06F 3/0482; G06F 3/04842; G06F 3/04847; G06F 16/951; G06F 30/00; G06T 11/00; H04L 65/40
See application file for complete search history.

(56) References Cited

U.S. PATENT DOCUMENTS 7,228,283 B1 * 6/2007 Hornstein ............... G06Q 99/00
705/26.1
11,475,497 B1 * 10/2022 Banschick ............. G06F 3/0482
(Continued)

*Primary Examiner* — Maurice L. McDowell, Jr.
(74) *Attorney, Agent, or Firm* — Hoffberg & Associates; Steven M. Hoffberg

(57) ABSTRACT

A system and method for the aesthetic design of a modular assemblage, comprising means for providing a client graphic user interface for receiving an input for defining parameters of the modular assemblage, and for presenting an image of the defined modular assemblage; communicating a code to a server representing the defined parameters; at the server, in dependence on the communicated code, defining a set of graphic elements corresponding to the defined modular assemblage; communicating the graphic elements from the server to the client; and displaying, at the client, the graphic elements received from the server to represent the defined modular assemblage.

20 Claims, 8 Drawing Sheets

Related U.S. Application Data continuation of application No. 16/167,067, filed on Oct. 22, 2018, now Pat. No. 10,748,199, which is a continuation of application No. 15/443,731, filed on Feb. 27, 2017, now Pat. No. 10,108,999, which is a continuation of application No. 14/287,329, filed on May 27, 2014, now Pat. No. 9,582,163, which is a continuation of application No. 13/895,779, filed on May 16, 2013, now Pat. No. 8,736,604, which is a continuation of application No. 13/540,595, filed on Jul. 2, 2012, now Pat. No. 8,446,407, which is a division of application No. 11/969,825, filed on Jan. 4, 2008, now Pat. No. 8,212,805.

(60) Provisional application No. 60/883,595, filed on Jan. 5, 2007.

(51) Int. Cl.
*G06F 30/00* (2020.01)
*G06Q 10/101* (2023.01)
*G06Q 50/12* (2012.01)
*G06T 11/00* (2006.01)
*H04L 65/40* (2022.01)

(52) U.S. Cl.
CPC ......... *G06Q 30/0643* (2013.01); *G06Q 50/12* (2013.01); *G06T 11/00* (2013.01); *H04L 65/40* (2013.01)

(56) References Cited

U.S. PATENT DOCUMENTS

| | | | | |
|---|---|---|---|---|
| 2002/0059186 | A1* | 5/2002 | Weber | G06Q 40/04 |
| 2002/0093538 | A1* | 7/2002 | Carlin | G06Q 30/02 |
| | | | | 715/778 |
| 2003/0231185 | A1* | 12/2003 | Kupersmit | G06T 11/001 |
| | | | | 345/589 |
| 2006/0111878 | A1* | 5/2006 | Pendyala | G06Q 10/0875 |
| | | | | 705/29 |
| 2007/0043627 | A1* | 2/2007 | Cooperman | G06Q 30/0641 |
| | | | | 705/14.54 |

* cited by examiner

| | | | | | | |
|---|---|---|---|---|---|---|
| Pompoms | Iridescent White | Tassels | Purple | | Candy | After Dinner Mints |
| | [add] | | [add] | | | [add] |
| | [add] | | [add] | | | |
| | [add] | | [add] | | Ribbon | Purple |
| | [add] | | [add] | | Base | Blue Lace Gold Base |
| Save | [add] | | [add] | | | |

| | | | | | | |
|---|---|---|---|---|---|---|
| Pompoms | Iridescent White | Tassels | Purple | | Candy | After Dinner Mints |
| | [add] | | [add] | | | [add] |
| | [add] | | [add] | | | |
| | [add] | | [add] | | Ribbon | Purple — 12 |
| Save | [add] | | [add] | | Base | Blue Lace Gold Base |
| | [add] | | [add] | | | |

| | | | | | | |
|---|---|---|---|---|---|---|
| Pompoms | Iridescent White | Tassels | Purple | | Candy | After Dinner Mints —— 11 |
| | [add] | | [add] | | | [add] |
| | [add] | | [add] | | | |
| | [add] | | [add] | | Ribbon | Purple |
| Save | [add] | | [add] | | Base | Blue Lace Gold Base |
| | [add] | | [add] | | | |

SYSTEM AND METHOD FOR PARAMETRIC DISPLAY OF MODULAR AESTHETIC DESIGNS

CROSS REFERENCE TO RELATED APPLICATIONS

The present application is a
Continuation of U.S. patent application Ser. No. 16/995,796, filed Aug. 17, 2020, now U.S. Pat. No. 11,475,497, issued Oct. 18, 2022, which is a
Continuation of U.S. patent application Ser. No. 16/167,067, filed Oct. 22, 2018, now U.S. Pat. No. 10,748,199, issued Aug. 18, 2020, which is a
Continuation of U.S. patent application Ser. No. 15/443,731, filed Feb. 27, 2017, now U.S. Pat. No. 10,108,999, issued Oct. 23, 2018, which is a
Continuation of U.S. patent application Ser. No. 14/287,329, filed May 27, 2014, now U.S. Pat. No. 9,582,163, issued Feb. 28, 2017, which is a
Continuation of U.S. patent application Ser. No. 13/895,779, filed May 16, 2013, now U.S. Pat. No. 8,736,604, issued May 27, 2014, which is a
Continuation of U.S. patent application Ser. No. 13/540,595, filed Jul. 2, 2012, now U.S. Pat. No. 8,446,407, issued May 21, 2013, which is a
Division of U.S. patent application Ser. No. 11/969,825, filed Jan. 4, 2008, now U.S. Pat. No. 8,212,805, issued Jul. 3, 2012, which
Claims benefit of priority from U.S. Provisional Patent Application Ser. No. 60/883,595, filed Jan. 5, 2007,
and is related to U.S. patent application Ser. No. 13/540,589, filed Jul. 2, 2012, now U.S. Pat. No. 8,988,418, issued Mar. 24, 2015, which is a Continuation of U.S. patent application Ser. No. 11/969,825,
the entirety of which are expressly incorporated herein by reference.

BACKGROUND OF THE INVENTION

1. Field of Invention

This invention relates generally to parametric design software, and more particularly to systems and methods providing a human computer user interface for aesthetic design of a modular assembly.

2. Status of Prior Art

On festive occasions, such as an engagement, wedding, Bar Mitzvah, confirmation or birthday party, it is often the practice to adorn each table where the guests gather with a centerpiece in the form of a vase or bowl containing a bouquet of cut flowers. The flowers are normally distributed to only a single guest because of inherent transport limitations, e.g., that cut flowers require a vase with water. Distribution is further limited in that there is but one centerpiece typically provided per table, and also because the beauty of flowers is enhanced by their arrangement into a bouquet. Thus, if a host desires that each guest receive a party favor, a separate gift must be provided.

When the festive occasion is a birthday party for a child and many other guests are children, the tables are usually laden with candy. At the conclusion of the party, each person in attendance is given a small bag of candy as a parting gift, especially since children typically attach little value to flowers. Thus, in this case, flowers are inappropriate as a party favor, although they might still be provided as a centerpiece.

See, U.S. Pat. No. 5,683,762, expressly incorporated herein by reference.

One issue presented by such centerpiece designs described in the above patent is that there are a large number of degrees of freedom in the design. For example, a typical centerpiece has a base, 10 extending elements, each element having a candy-filled tube, an encircling spiral ribbon, a pom-pom, and a set of apical ribbons. Each element may have a different set of design parameters (e.g., colors), for the candy layers, pom-pom, encircling ribbon, and apical ribbons. The theoretical number of possibilities is in excess of billions. Given the large number of possibilities, it is difficult to envision the aesthetic effect of the color combinations without a suitable tool.

SUMMARY OF INVENTION

The present invention provides a software system which is usable for parametric display of modular aesthetic designs.

A preferred embodiment of the system comprises a client and a server. The client provides a user input for making selections of the design parameters, and a display for presenting a visual depiction of the resulting design. The server receives codes from the client, representing the parametric selections, and returns one or more files which together represent the aesthetic representation of the design.

The system is preferably interactive, that is, a user enters one parameter at a time, and the display updates in dependence thereon. Preferably, the display is a composite of a plurality of image component files, for example within a Macromedia Flash Player environment, such that a parameter change need only require updating of a portion of the files.

Advantageously, the image component files are pre-rendered for the various options, and selected by the server as required. Preferably, there are about twenty image component files which form a composite image. Further, the image component files are preferably rendered in planes, with an overlay plane obscuring portions of underlay planes.

The system may be used in conjunction with a recommender or guide, which assists a user in formulating an aesthetically pleasing result. This functionality may be implemented local to the user, at the server, or at another location.

For example, a user may define a color scheme for an event. These colors are then used to define a theme for the aesthetic design, which will generally include significant elements having corresponding colors, themes, and possibly other elements with suitably contrasting, complementary, alternating or neutral colors. In addition, these elements are automatically arranged in a suitable pattern and distribution of the color or theme elements, thereby achieving an optimal arrangement or composition as relates to contrasting, complementary or neutral colors. As a result, these elements are suitably organized in a pattern of distribution to achieve a complementary, contrasting, alternating or neutral color scheme, thereby reducing the likelihood of color discordance or color position asymmetry.

Further, the system preferably imposes various design constraints on the user to limit the scope of selections to a manageable number. For example, the maximum number of color choices presented may be less than the theoretical maximum. Likewise, arrangement of colored elements may be algorithmically determined rather than explicitly determined.

While a preferred embodiment of the invention is used for the aesthetic design of a manufactured system, a similar modular aesthetic design problem occurs in floral arrangement design (natural or artificial), and the present systems and methods can be applied to this venue as well. Thus, for example, a floral design may start with any of 10 standard baskets, having placement locations for 24 flower elements, each flower having a type, color (optional), stem length, and position. For example, for each of the 24 positions, there may be 25 different flower types, up to 12 different colors (e.g., carnations), 5 stem lengths. In theory, this leads to about 360,000 different combinations.

Another embodiment of the invention is employed for designing gift baskets. In this case, each element in the basket preferably is visible, but various basket contents have different shapes and sizes. Therefore, the basket area is divided into a grid, with some overlap possible. Each possible content is selected, with an organization optimizer to layout the contents for feasible placement in the most visually pleasing organization and spacing. In this case, a recommender may provide complementary items, such as cheese and crackers, or otherwise implement other design rules.

The present invention may also be used to model layouts of other types of manufactured items, such as cookie baskets and displays, other baked goods, fruit displays, and the like.

In some cases, the range of subcomponents is not predetermined in the system, and therefore arbitrary objects (so long as they are available in an appropriate data format) may be available for selection by a user. Thus, instead of expressly presenting all of the various options in menus and/or submenus, a search engine may be provided for use within the user interface to identify and select optional elements. In this embodiment, a user searches for elements, using words, colors, topics/classifications, or the like, and receives a menu or list of available options corresponding to the query. Typically, the response to the query will include an image of the object, and a retrieval of a record associated with a selected object will include one or more graphics files or models which are suitable for rendering, or to be rendered, within the user interface.

In some cases, the placement of the selected object within the assemblage can be contemplated, and therefore the graphics files pre-rendered for ready use. On the other hand, the assemblage may have an arbitrary shape and/or size, and the user may select various other objects, so it may be difficult to pre-render the graphic files. Therefore, a full three-dimensional model of the object, or at least its exterior, is provided, which is then used as necessary to generate the images to be displayed on the user interface screen. It is noted that the user interface may itself support rendering of three-dimensional models, and therefore the pre-rendering step is optional. Likewise, the search engine may be a cooperative system, providing a dedicated client-server relationship, or the client may search public search engines for the objects. Further, the search function and model acquisition may also be decoupled. For example, a user may search for objects to fill a gift basket, e.g., cheese and crackers, and may then select particular brands of cheese and crackers. After selecting these objects, a second retrieval operation may seek specific graphic or model files from a manufacturer's or distributor's website. These may be defined, for example, by SKU or other unambiguous code. The searched product subcomponent may have a readable code that classifies the item by ingredients (such as sugar free or low carbohydrate) or by size (number of ounces) or color or manufacturer, or country of origin or other characteristics that the user may deem important in searching for components to create the desired virtual representation and organization of the entire assemblage. This search engine functionality also permits an interface to various advertising subsidy systems, such as the Google Adsense® system, and further permits e-commerce integration and referrer compensation and product sponsorship revenue.

It is therefore an object of the invention to provide a method for the aesthetic design of a modular assemblage, comprising the steps of providing a client graphic user interface for receiving an input for defining parameters of the modular assemblage, and for presenting an image of the defined modular assemblage; communicating a code to a server representing the defined parameters; at the server, in dependence on the communicated code, defining a set of graphic elements corresponding to the defined modular assemblage; communicating the graphic elements from the server to the client; and displaying, at the client, the graphic elements received from the server to represent the defined modular assemblage.

It is a further object of the invention to provide a method for the design of a parametric aggregation of a plurality of different components, comprising the steps of providing a graphic user interface for receiving an input for defining parameters of the parametric aggregation, and for presenting an image of the defined parametric aggregation; in dependence on the parameters, defining a layout of a set of graphic elements representing a physical organization of the parametric aggregation; displaying the layout of the graphic elements in the graphic user interface to represent the organization of the parametric aggregation; receiving user feedback relating to acceptance of the displayed layout; and storing information defining the accepted displayed layout sufficient for physical organization of the parametric aggregation in accordance therewith.

It is a still further object of the invention to provide a method for the design of an arrangement of a plurality of different components, comprising the steps of receiving an input from a user defining a selection of the plurality of components, the defined plurality of components having associated physical attributes; arranging the plurality of components into a composition in dependence on their physical attributes and an aesthetic criteria relating to the coordinating of at least one of an appearance, predominance, and distribution of the plurality of various components; visually presenting at least one composition from a plurality of available discrete layouts to the user; selecting, by the user, one of the plurality of available discrete compositions; and generating a description of the selected composition, the description being adapted for implementation thereof as a physical composition of the plurality of components.

Another object is to provide an arrangement of a plurality of different components, designed by a method comprising the steps of receiving an input from a user describing the plurality of components, each component having associated physical attributes; proposing a composed arrangement of the plurality of components in dependence on the physical attributes of each component and an aesthetic criteria relating to a coordinating of at least one of an appearance, predominance and distribution of the plurality of components; visually presenting the proposed composition to the user; receiving at least one of a confirmation and a modification of the proposed composition from the user; and generating a description of a confirmed composition, the arrangement being physically manufactured in accordance with the description.

It is a still further object to provide a computer readable storage medium, having thereon instructions for operating a programmable device adapted to design an arrangement of a plurality of different components, by performing the steps of receiving an input from a user defining a selection of the plurality of components, the defined plurality of components having associated physical attributes; arranging the plurality of components into a composition in dependence on their physical attributes and an aesthetic criteria relating to a coordinating of at least one of an appearance, predominance and distribution of the plurality of components; visually presenting at least one composition from a plurality of available discrete compositions to the user; selecting, by the user, one of the plurality of available discrete compositions; and generating a description of the selected composition, the description being adapted for implementation thereof as a physical composition of the plurality of components. The programmable device may store a history of user input and/or a history of user interaction. The programmable device may also create a user profile associated with a specific user.

A graphic user interface may receive a user query for communication with a remote search engine. The remote search engine may respond to a user query with available parameters, such as physical parameters, for at least one component. A component may be defined by a plurality of physical parameters. For example, the components to be employed may be undefined at the initiation of a session, and the user may employ the search engine to select components. On the other hand, one or more of the components may be selected, and a search engine may be employed to provides additional components which meet certain criteria appropriate for the ensemble. The search engine may employ both functional and aesthetic criteria to select components, and in some cases, the components may be parametrically or incrementally defined, according to functional and/or aesthetic criteria. For example, color, size, weight, shape, ornamentation, type, complementarity with other components which have been selected, or will be selected, may all be employed to assist in defining the component or a set of components from which a user may ultimately select. The plurality of components may be, for example, of similar kind with respectively different parameters. In many cases, a parametric search engine query will set bounds on component parameters, and therefore the response to the query should include the actual parameters of the component or an aggregate set of components. To the extent that aesthetic features are not physical in nature, these features are also preferably returned in the query. While an image of the component may be suitable, preferably, a model or encoded set of attributes (such as an XML document) is provided, so that the ensemble can be appropriately formulated from a plurality of components.

The search engine may comprise an index of items which have not been prescreened or otherwise validated for use as components (such as a regular Internet search engine), or a may comprise a catalog of available components which have been screened or approved or selected as being appropriate. The catalog or index may further comprise images of respective components and physical parameters thereof. For example, a search query parameter may represent a visual appearance of a component, such as a color or color scheme.

The graphic user interface may comprise a user-selectable palette for interactive modification of the components. The graphic user interface may communicate through the Internet (or other suitable network) with a server, and, for example, a software construct may respond to a parametric code to generate a display of the layout of the graphic elements. Thus, for example, the display of components is generated based on a set of codes defining individual components or sets of components, preferably along with logic which may be part of the software construct which automatically arranges or aggregates the components based on a set of rules, which may be aesthetic and/or functional in nature. The software construct, for example, runs locally on a user PC, on a server communicating through a network such as the Internet, or on another system. The software construct preferably interfaces through a graphic user interface, such as Microsoft Windows of Vista, or through a web browser such as Internet Explorer 7 or Firefox.

At least one of the plurality of components may be comestible and/or perishable. Such items may have a limited shelf life. In many cases, the ensemble is prepared ad hoc, and is not intended to be an inventoried item.

The at least one composition may be automatically generated based on an aesthetic paradigm. Thus, for example, the components may be arranged, or other elements of the composition defined, based on a set of rules or an algorithm or another implicit or predefined scheme. This assists users in obtaining a composition which meets certain design rules, which may assure a desired aesthetic result or range. For example, the composition may be generated based on an automated algorithm sensitive to component color. More broadly, the composition may be generated based on an automated algorithm sensitive to at least one of: a color of at least one component, a dimension of at least one component, a temporal or spatial coordination of at least two components, a cost of at least one component, a visual relationship between at least two components, a weight of at least one component, and an availability of at least one component. With respect to dimensionality and weight, the composition may have predefined limits. For example, a container or shipping box may be predetermined, or a shipping class predefined, which sets a limit on the composition. Therefore, each element within the composition, and the aggregate set of elements, must meet the limits. On the other hand, some parameters may be aesthetically constrained. For example, certain color combinations may be preferred or undesirable. In other cases, a synchrony (relating to a temporal coordination of component system) and/or availability of elements may be considered. For example, a fresh fruit basket should generally be designed to employ concurrently available ripe fruits. Pricing and component pricing paradigm may also be relevant considerations. For example, in a fixed price arrangement, components must be selected (either individually or in the aggregate) which meet the pricing presumptions. The components and ensemble of components may have complementary attributes which are preferably considered. Thus, a selection of one component may influence the selection of another, such as cheese and crackers, or wine and wine glasses. The coordination, as discussed above, may include color, shape, size, weight, and the like.

A number of available compositions may be constrained in accordance with predetermined selection criteria. Thus, one aspect of the invention intentionally limits the available selections, and does not permit an unrestrained choice space. On the other hand, in the case of a search engine which responds to a user search engine query, which may search for items which may have been previously unknown, the choice space may be arbitrarily large.

The components are not limited to comestible or perishable goods, and for example, may include electronic devices.

BRIEF DESCRIPTION OF THE DRAWINGS

For a better understanding of the invention as well as other objects and further features thereof, reference is made to the following detailed description to be read in conjunction with the accompanying drawings, wherein.

DETAILED DESCRIPTION OF THE PREFERRED EMBODIMENTS

The decorative end closure preferably comprises a pom-pom, and more preferably a pom-pom having floral characteristics. The floral pom-pom provides an aesthetic similarity to a cut flower when attached to a hollow elongated member, and when a plurality of decorative containers arranged together provides an aesthetic substitute for a floral bouquet or centerpiece. Pom-pom decorative elements may also invoke other aesthetic significance. The pom-pom preferably has a set of apical ribbons extending therefrom, for example 6 ribbons, which may be the same or different colors.

A transparent elongated tube supports the pom-pom, and is filled with various materials, such as candy, nuts, or dried fruit, confetti, colored or flavored liquids or powders such as cosmetics, cookies, fabric, cigars, feathers and other decorative or consumable elements. The contents of the tube may be formed in layers, for example 6 layers over a one-foot length. A spiral ribbon may encircle the tube. A number, for example ten, of the pom-poms are supported in a base. Each pom-pom can theoretically be different, alternating in a pattern or comprising the same color in every position, based on a number of assumptions.

The present provides software generating a human computer user interface, along with other relevant software that makes it possible to create virtual representations of a custom manufactured product over the internet or locally (in this case, a candy centerpiece), which can then be manufactured according to the exact specifications defined by the client. This "direct-from-design-to-manufacturing" process is based on a code, representing the design created by the user, which is readily translated into a design layout. For example, the code may be human readable, to permit a non-automated or semi-automated assemblage system, or a fully automated system may be implemented. When the design space is limited, preferably the limiting presumptions are applied to provide an even or distributed result. Thus, if there are ten pom-poms, the color space may be limited to 5 options, such that there are a minimum of two pom-poms of each selected color. If it is desirable to assist in assigning various colors to possible positions in the array, then the pom-poms may be automatically dispersed over the arrangement, based on a presumption that a concentration of a particular color in one location is desirable or undesirable. As the number of colors of pom-poms is increased, the arrangement is organized and reorganized to provide a proper distribution of the pom-pom colors.

Figure 1:
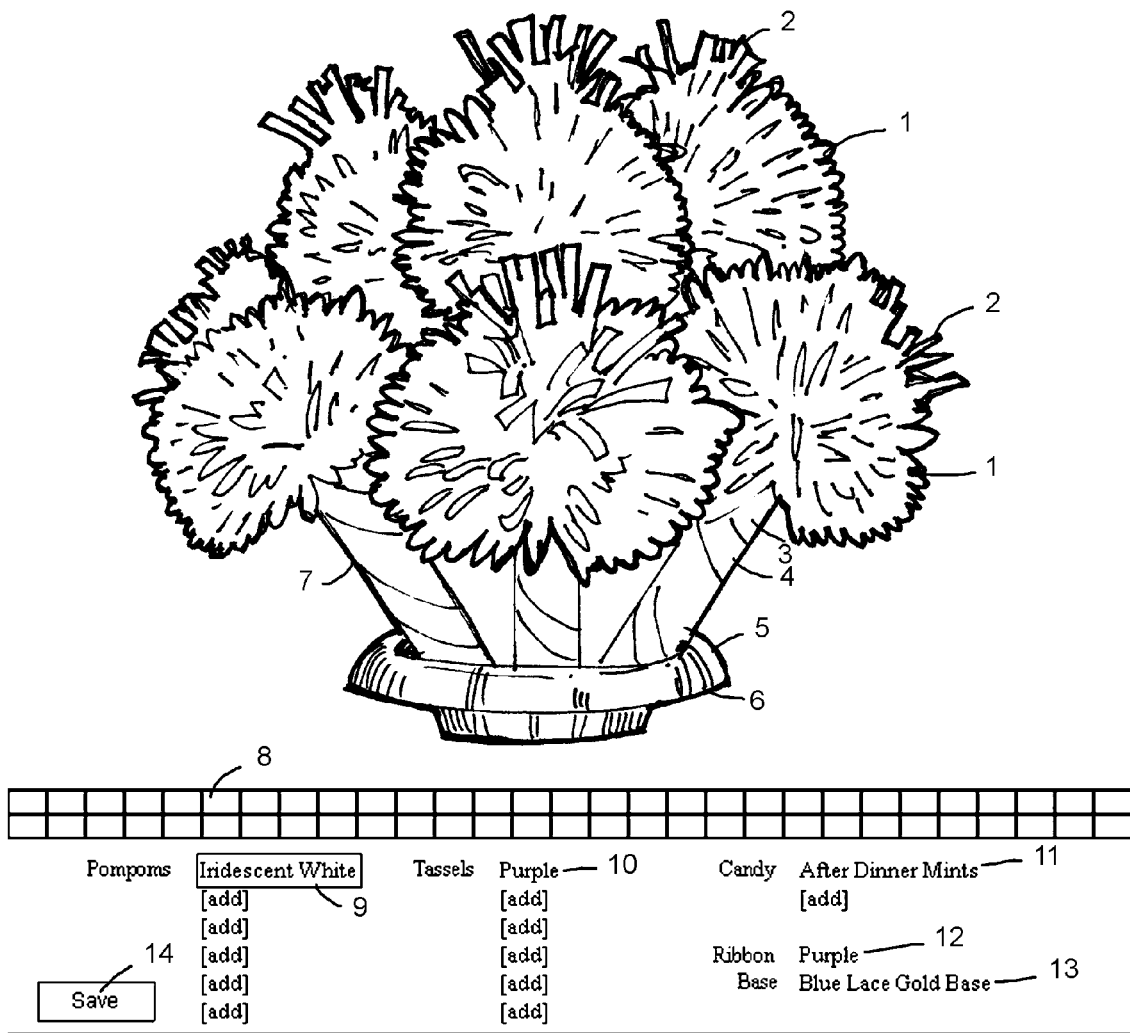
FIGS. 1-7 show various states of a client user interface screen according to a preferred embodiment of the invention.
Figure 2:
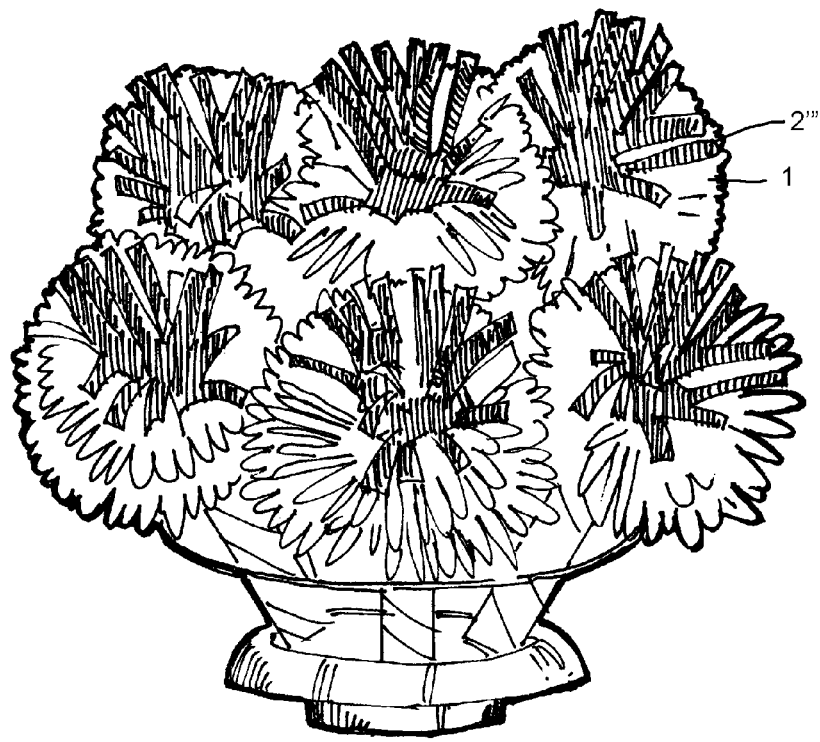
Figure 3:
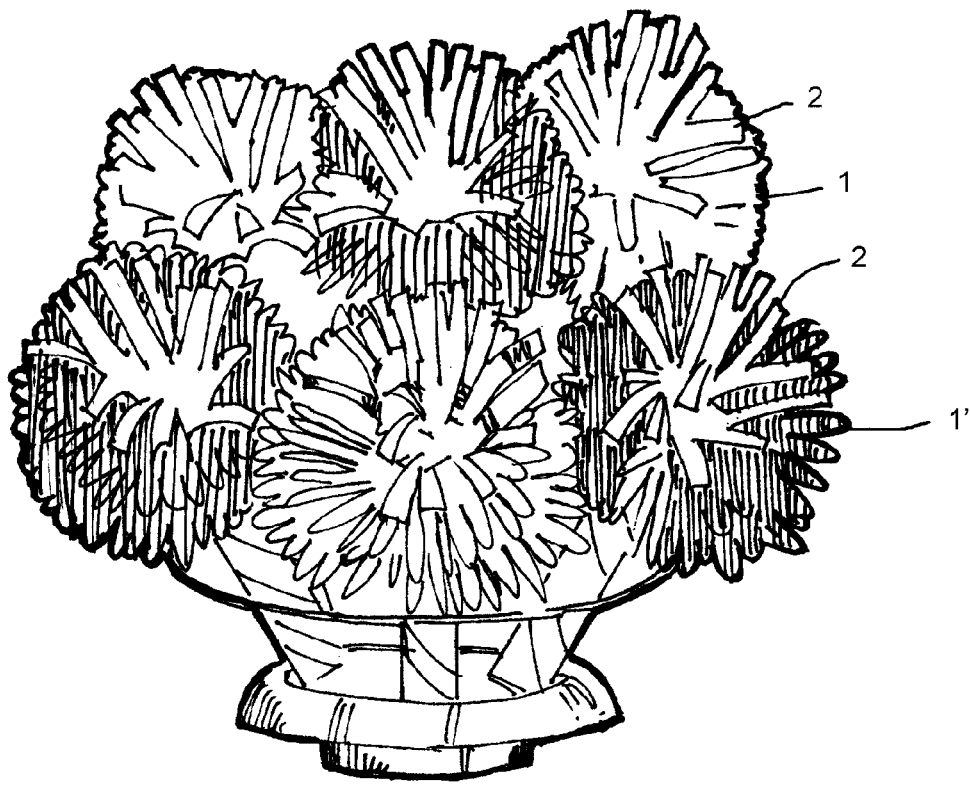

The system preferably operates using an Internet communications system, wherein a client system uses a web browser and optionally plug-in software, such as Macromedia Flash player, using a simple control panel interface that in various steps completes the design. A preferred interface is shown in FIG. 2. The client communicates with a server system. Exemplary code for the server software is provided in a source code appendix, attached hereto and expressly incorporated herein by reference. The server architecture is represented in FIG. 1.

A preferred architecture for the product to be designed, and the graphic representations thereof, breaks the product down into sufficient components and subcomponents to actually make it a custom-made product, and not just a selection from a few standard options. If there are only five options total, a parametric design system is superfluous.

A preferred "design tool" has a control panel with colored buttons that allow the user to select different colors for different sub-components. The result is a centerpiece completely customized, with permutations calculated to be beyond quadrillions in number.

The preferred system supports the adding of color on a subcomponent basis, which includes increasing the frequency of subcomponents with certain colors or decreasing the frequency of subcomponents of another color in distributed patterns of contrasting, complementary, neutral or, alternating colors, or colors selected by the user according to their own preference. In addition to increasing or decreasing frequency of elements with a certain color, different subcomponent elements may be spatially repositioned to more realistically create a balance of colors. In other words, if we want to add more black pom-poms to the bouquet, the program knows, aesthetically speaking, to organize the black pom-poms in a random looking array so that all the black pom-poms are not just on one side of the bouquet. This has applications in virtual flower arranging and gift basket arranging as well.

Figure 8:
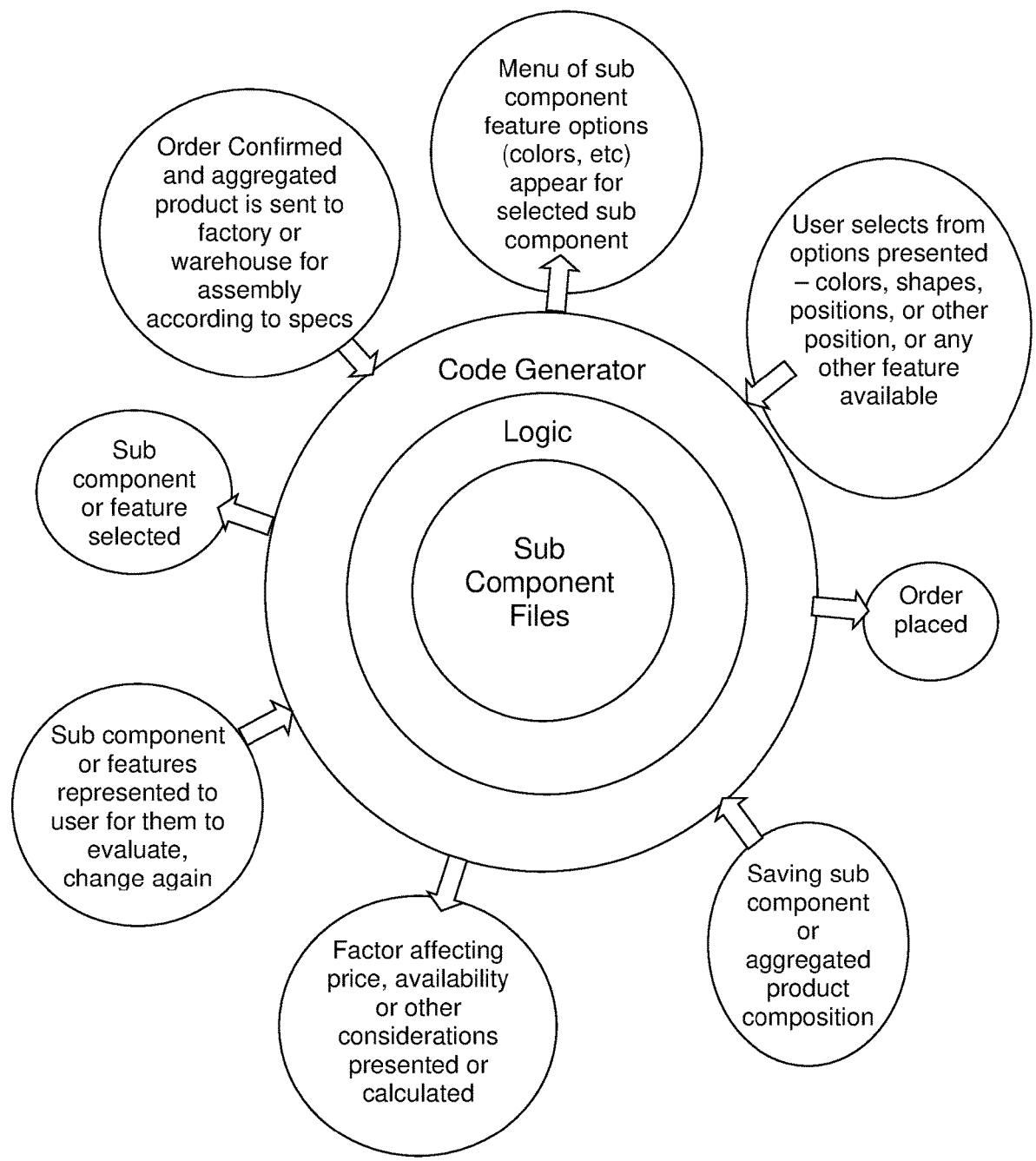
FIG. 8 shows a schematic diagram of a preferred embodiment of the system.

The system, schematically shown in FIG. 8, supports online designing products from "scratch," e.g., assembling components and subcomponents into a complete unit to the customer's liking. In order to properly represent the assemblage, a three-dimensional model representation of each element or sub-element is provided, often achieved by automated rendering software. One of the requirements of this three-dimensional model is that it visually represent what each subcomponent would look like if it were placed in different x, y and z coordinates in the arrangement (array). All these possible positions would be modeled and a file would have to be made for each component in each position in every possible color to have maximum design possibilities. This leads to the creation of hundreds, or even thousands of colored and spatially positioned subcomponent files. Of course, it is also possible to render the components or the entirety in real time, but this approach is computationally expensive, and difficult to scale. That is, the number of simultaneous users would be substantially limited. In contrast, the pre-rendered component files are readily called through a server file system, based on a translation of the arrangement code received from the client software, thus potentially supporting a large number of simultaneous users and also minimizing the download time.

It is noted that, in some cases, it may be desirable to communicate a three-dimensional model to the client, including each component. This architecture permits client-side rendering of various views and lighting conditions.

Each image of every component in possible positions is assigned to a graphic file, such as a ".png" file, which allows sufficient transparency or opacity properties that layers can be built up from the components. These layers have to be mapped to make sure that files representing the objects closest to the viewer are on top of the layers further away.

A control panel is provided to manipulate these layers of subcomponent image files in accordance with algorithms that define the aesthetic of the end product. For example, in a preferred embodiment, when the client requests to have two different color pom-poms, the program reorganizes the pom-poms accordingly to a distributed pattern. When a third color pom-pom is added to the mix, such as in a red, white and blue bouquet, then the pom-poms are again reorganized. And when a fourth color pom-pom is added, once more all the pom-pom colors for each position are reorganized again to reflect a predetermined parameter of color balance that is desirable. Alternatively, the system could be requested to allow more user control over exact positioning.

Using similar principles to design a virtual gift basket, we take into consideration the three-dimensional special requirements of each product in the gift basket as well as the optimal aesthetic look—should all the tall items be on one side of the basket or should they be arrayed according to some other principle?

The system also preferably calculates which type and class of subcomponents are added and how that will affect cost, shipping, weight, etc. The design software therefore preferably interfaces with e-commerce software, to facilitate cost estimation and ordering.

Another possible feature of the present system provides subcomponents which are of sufficient granularity to allow for the user to achieve gradual changes as opposed to visually sudden graphic color changes. This kind of control is referred to as color blending or subcomponent feature accrual when applied to shape and size of the composited component. According to an embodiment of the present invention, the end user is provided with color blending control, which means that by manipulating subcomponents the user can affect gradation of color changes as opposed to a discrete color choice. Advantageously, the user may be provided with a user interface element which acts like an analog control for example a slider or knob, to adjust the value(s), which are then interpreted by the system to define the blending, length or size. The interpretation of the input control need not be linear, and therefore logical elements may be provided to assist the user in formulating aesthetically pleasing results while reducing the interface complexity and decision-making complexity.

The method according to a preferred embodiment of the invention is as follows:

Subcomponents are identified that can vary by pattern of color, shape, position, composition, mixing, blending, timing, quantity and other factors that can be distributed in a pattern that affects the overall product appearance, shape, composition, and other factors. For example, pom-poms can be arranged in any available color in any of several defined positions. Initially, all the pom-pom subcomponent elements may be presented in the same color or some other initial state as defined by the system such as a default color composition or a saved version of the user's choice. Additional color pom-poms can be introduced, and the system will have to accommodate this new color into the pattern. Similarly, if one or more pom-pom colors are introduced, the system must accommodate those added colors in a new pattern that takes into account the design logic that is defined for the aggregated product.

Patterns can also be created by breaking down a sub element, like tassels (e.g., apical ribbons), into component parts which are combined together to produce the desired overall affect in the subcomponent. In order to simplify the user interface, and to impose design constraints, some aspects of the design are constrained by the system, for example in a manner designed to achieve an aesthetically pleasing result. For example, an even distribution of elements throughout an arrangement may be preferred over one which is asymmetric or polarized.

In this way, all like subcomponents (e.g., tassels combinations) can be created from combining layers of subcomponent elements which create a composite. For example, each tassel subcomponent element can be specified for a specific color. There are six separate subcomponent tassel elements that comprise the entire tassel assembly. By layering into multiple subcomponents that are composite, a degree of color control that is referred to as color blending.

For example, all six layers can be royal blue. Or if we wish to introduce a splash of white, we can choose to make one of the layers as white. And then if we want more white, we can change another of the six blue layers white. Such a system requires a way of changing one subcomponent element at a time.

A feature is provided that allows all the subcomponent elements to be set or reset at once to a particular color or feature, as well as being able to fine tune the composite by selecting individual layers for change, for example, features such as color, shape, position, quantity etc., may be set or reset.

The patterns are affected by the distribution and balance of colors as different color pom-poms or subcomponent elements are added to the mix. The overall appearance of the aggregated product is affected by changes in subcomponent patterns. Separate subcomponents are placed in different layers, facilitating their rendering and display through the graphic user interface. For example, 8-12 layers may be provided for pom-poms; one layer for each position. Each layer is populated by a graphic component file, selected from ones rendered in a particular color, and specific for a particular position in the arrangement.

Subcomponents are separated into small subcomponent elements, where possible, to create even more variability in the final aggregated product.

For example, the preferred embodiment provides a formula of 36 subcomponent tassel elements, six in each layer. The finer the definition, the more control over the final aggregated product.

For the candy, a maximum of two colors per tube was imposed as a limitation. These include bottom layer candies, top layer candies and tubes with candies of all one type. It is also possible to mix the candies, rather than to layer them.

A projection of a three-dimensional model of each subcomponent, rendered in each color option and position, is created and stored. The server software selects appropriate stored files for communication to the client. Images files may have transparent or semitransparent portions, and employ image formats such as ".png".

The stored files have an encoded filename, allowing the server to specify the desired files by their parametrically encoded filenames.

The client defines an arrangement by way of a code, which defines every selected option. Preferably, this code is human-readable, and employs 1-3 characters to represent every attribute. Blank attributes are indicated by "X"s. The code, in addition to being usable by the server to define the image components, may also be used to define the manufacturing parameters, and by an e-commerce engine to permit pricing and ordering.

Various logic modules may be designed for organizing, reorganizing, positioning, and repositioning subcomponent or subcomponent elements into an arrangement of layers that adhere to the design instructions of the user through the interface, as well as possibly organizing, reorganizing, position and repositioning subcomponents and subcomponent elements according to a predefined logic that optimizes characteristics important to the final aggregated product such as color balance or color harmony, relative position of subcomponents, and minimization of aesthetic or positional or other conflicts between elements that can occur when no logic is applied.

A database of arrays is created for holding subcomponent and subcomponent element files for the purpose of being manipulated by the design logic modules. The database remembers what was created by a user, so that changes can be saved. If desirable, a system of having a user login and password is implemented whereby the server can record the status of a user session. User attributes such as name, email address, name of design or other user or design information are thus enabled. Likewise, a method of tracking designs, design updates and changes, and designer activity is also enabled. A system of administering the various users may be implemented whereby an administrator can allow or disallow access to the system, or various features thereof, by users according to date, class of user, such as a party planner or end user or other parameters made available to the administrator. In addition, such an administrative tool can allow the administrator to manage user accounts, view designs created by users, record or monitor changes, customer orders, updates, patterns of use, and other tools to enable an administrator to comprehensively oversee and monitor system usage. This tool further permits pricing and discounts to be dependent on a user identity or classification.

The system can also be enabled to communicate with an inventory-type database that can automatically advise the server as to which component or subcomponent color elements are currently available. In the preferred embodiment, the component or subcomponent elements which are not available are removed from the menu or color selections available to the user in the interface. Likewise, if certain combinations are already in inventory, these may be differentially priced as "catalog" instead of "custom".

The system permits calculation of costs, availability, production time and other factors relevant to the production and purchasing of the assembled product. The information may be efficiently communicated to a factory, assembly area or warehouse, to facilitate manufacturing and coordinate between the various centers within the production process.

FIGS. 1-7 show an arrangement of components in a base. Each component includes subcomponents, which comprises a pompom 1, having tassels 2, supported by a tube 7, containing candy 8, encircled with a ribbon 4. The base 5 may also be decorated 6, and supports the components in a predefined arrangement. A graphic user interface is represented in the bottom of FIGS. 1-7. A color palette 8 provides color choices. For example, a user selects a pompom 1 color 9, a tassel 2 color 10, a candy 3 type and color 11, a ribbon 4 color 12, and a base decoration 13. The pompom 1, tassel 2, and candy 11 can each have multiple concurrent selections. For example, the tassels 2', 2", and 2''' (shown in FIG. 6) are each a different color. After selecting a feature and a respective attribute, the user selects the "save" function 14, which transmits a code to a remote server representing the selection. In some embodiments, a map function may be employed which is remotely interpreted to indicate the location of the user interaction with a graphic.

FIG. 1 refers to an arrangement of the plurality of the components and their constituent subcomponents in an initial state presentation of the composition. The initial state can be defined by at least one of: user attributes, user preferences, aesthetic paradigms and physical attributes. Once an initial state is presented, the plurality of components can be re-ordered globally using a palette-based design system. The user selects a feature from the graphic user interface, and an attribute. For example, in FIG. 2, the user selected purple tassels 2''' on an iridescent white pompom 1, and since these were singular selections, all of the pompoms and tassels have the same color scheme. With these selections, the attributes of the other features remain constant. Subcomponents, such as the pompoms 1, 1' can be automatically re-positioned in the composition, such as in FIG. 3, based on sensitivity to color where the pompoms 1, 1' are distributed spatially and visually according to an aesthetic paradigm. Distribution can also be sensitive to, for example, size, price, weight, synchrony, balance and other physical and visual attributes.

Figure 4:
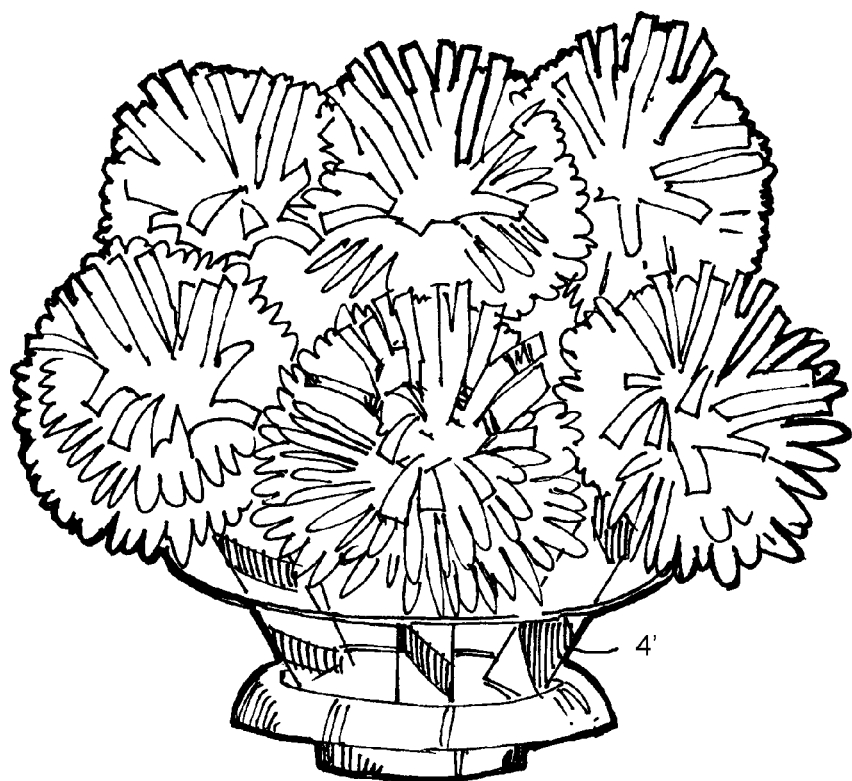
Figure 4:
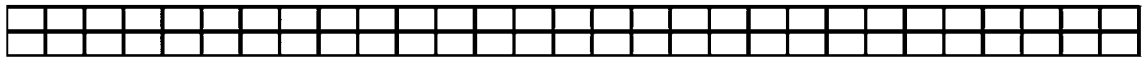
Figure 5:
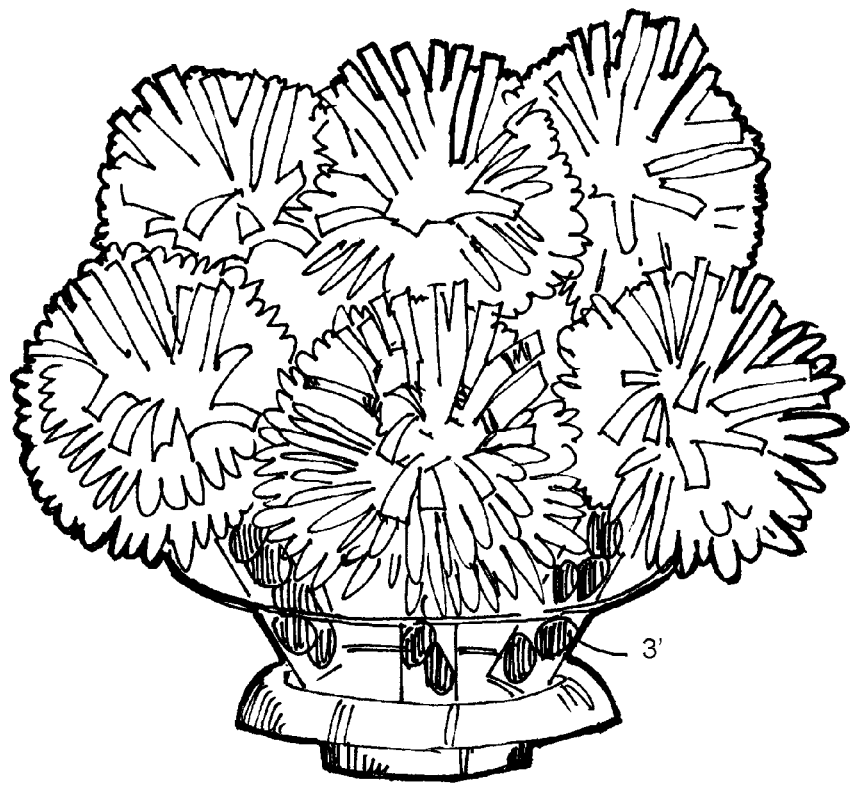

Of the plurality of components, some categories of components can be coordinated by a class of features, such as ribbons 4 as referred to in FIG. 4 or in concert with other classes of components such as the tassels. The plurality of components may contain, as one of their elements, comestible items such as candy 3', which as shown in FIG. 5 are after dinner mints 11, that can be defined and arranged parametrically, for example based on type and color combinations. In this example, more than one comestible item may be combined together to create unique blended combinations. The combinations can be replicated globally throughout similar tubular components as shown.

The entire composition can be arranged based on a presentation context such as a theme or overall packaging, unifying packaging and containers can be organized based on preference from the selectable palate. The base 5 element is selectable based on its color or decoration 13. It can also be adapted automatically according to contextual information such as room presentation.

Figure 6:
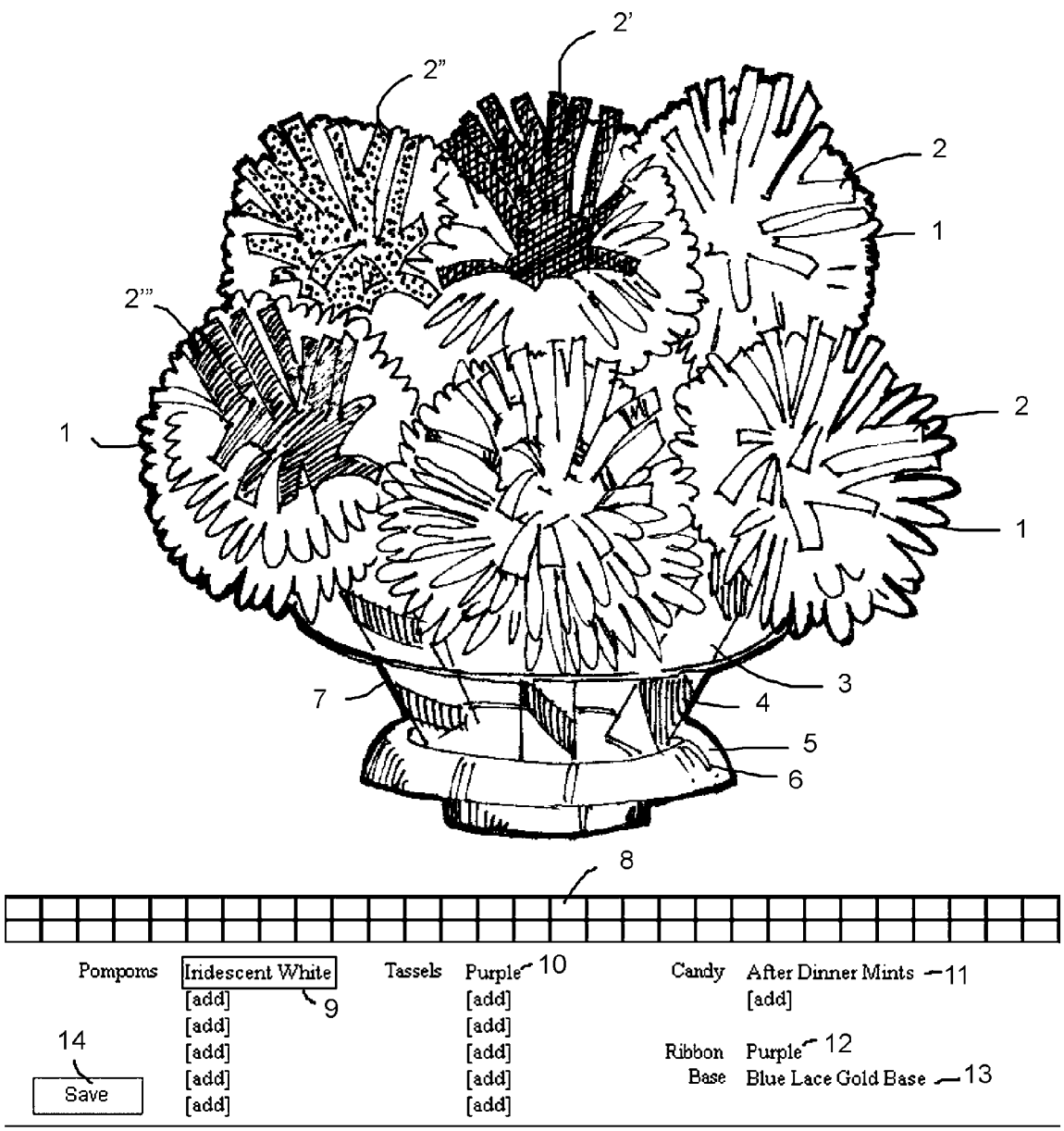
Figure 7:
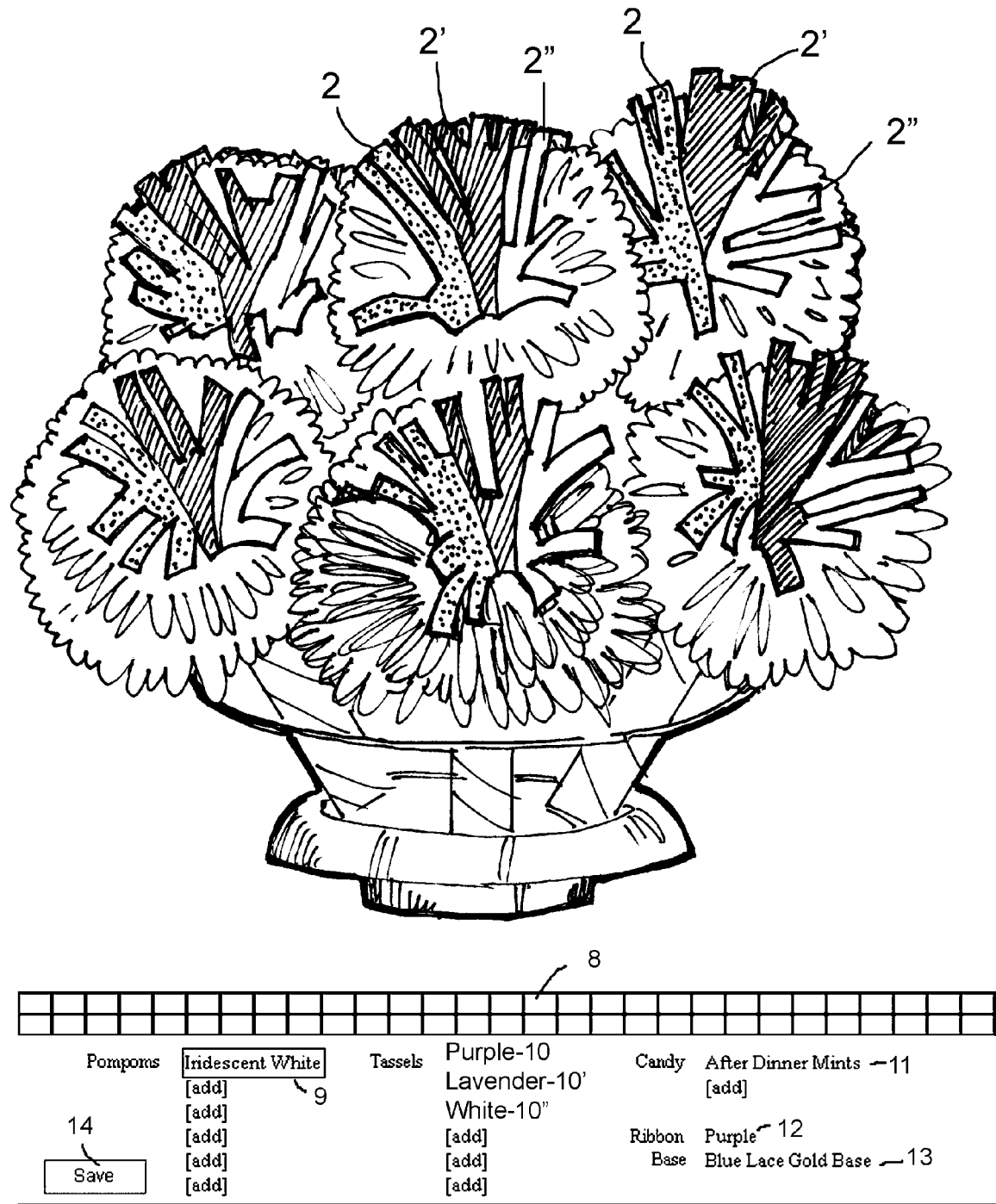

The parametric arrangement of the plurality of components may be coordinated according to the appearance, predominance and distribution of the components. The tassel 2', 2", 2''', features of different instances of a respective component, as shown in FIG. 6, may concurrently have a plurality of different colors, or a single instance of a respective component 2', 2", 2''' may have a plurality of colors 10, 10', 10", as shown in FIG. 7, based on different selectable colors sensitive to color pre-dominance for creating a blended color composition. Based on an automated arrangement algorithm, each component may be different from the others, or there may be sets of components of differing types.

While there have been shown and described preferred embodiments of a centerpiece assembly simulating floral bouquet in accordance with the invention, it will be appreciated that many changes and modifications may be made therein without, however, departing from the essential spirit thereof.

What is claimed is:

1. An interactive design method, comprising:
    storing a state of a user interaction;
    interacting with the user through a computer user interface to successively receive inputs from the user, separately updating a plurality of visual characteristics of a plurality of different objects dependent on the stored state;
    communicating the successively received inputs to a remote server through the Internet;
    organizing the plurality of different objects having the plurality of visual characteristics according to an aesthetic algorithm, and updating a rendering of the organized plurality of objects in response to each received response;

receiving the rendering of the organized plurality of different objects; and displaying the rendered organized plurality of different objects.

2. The interactive design method according to claim 1, further comprising manufacturing the plurality of different objects.

3. The interactive design method according to claim 1, wherein the received rendering of the organized plurality of different objects comprise executable code.

4. The interactive design method according to claim 1, wherein said displaying the rendered organized plurality of different objects comprises displaying the plurality of different objects in a plurality of overlaid layers.

5. The interactive design method according to claim 1, further comprising:

receiving a query from the user;

communicating the query to the remote server;

communicating the query from the remote server to an Internet search engine;

receiving, by the remote server, a response to the Internet search engine query from the Internet search engine;

extracting at least one parameter describing a respective proposed object from the response; and selecting the respective proposed object as a defined object based on the received input from the user.

6. The interactive design method according to claim 1, further comprising displaying an acquisition cost of the organized plurality of different objects.

7. The interactive design method according to claim 1, wherein the defined different visual characteristics comprise a color of the respective defined objects.

8. The interactive design method according to claim 1, wherein the defined different visual characteristics comprise a shape of the respective defined objects.

9. A non-transitory computer readable medium for performing an interactive design method, comprising:

instructions for storing a state of user interaction;

instructions for interacting with the user through a computer user interface to successively receive inputs from the user, separately updating a plurality of visual characteristics of a plurality of different objects dependent on the stored state;

instructions for communicating the successively received inputs to a remote server through the Internet;

instructions for processing a set of codes defining data and logic received from the remote server, which controls a user browser to automatically arranges or aggregates the plurality of different objects based on a set of rules;

instructions for organizing the plurality of different objects having the plurality of visual characteristics according to an aesthetic algorithm and the set of codes; and instructions for updating a rendering of the organized plurality of objects in response to each received response.

10. The non-transitory computer readable medium according to claim 9, wherein the rendering of the organized plurality of different objects comprise executable code.

11. The non-transitory computer readable medium according to claim 9, wherein the rendered organized plurality of different objects comprises a plurality of overlaid layers.

12. The non-transitory computer readable medium according to claim 9, further comprising:

instructions for receiving a query from the user;

instructions for communicating the query to the remote server;

instructions for communicating the query from the remote server to an Internet search engine;

instructions for receiving, by the remote server, a response to the Internet search engine query from the Internet search engine;

instructions for extracting at least one parameter describing a respective proposed object from the response; and instructions for selecting the respective proposed object as a defined object based on the received input from the user.

13. The non-transitory computer readable medium according to claim 9, further comprising instructions for displaying an acquisition cost of the organized plurality of different objects.

14. The non-transitory computer readable medium according to claim 9, wherein the defined different visual characteristics comprise a color of the respective defined objects.

15. The non-transitory computer readable medium according to claim 9, wherein the defined different visual characteristics comprise a shape of the respective defined objects.

16. The non-transitory computer readable medium according to claim 9, wherein the instructions for updating the rendering of the plurality of different objects comprise instructions to communicate executable code, and instructions for executing the executable code within the display of the user interface.

17. The non-transitory computer readable medium according to claim 9, wherein said instructions for updating the rendering of the plurality of different objects comprise instructions for rendering images of the defined plurality of different objects based on three dimensional models of the respective objects.

18. An interactive design system, comprising:

a memory configured to store a state of a user interaction;

computer executable code defining a computer user interface configured to interact with the user to successively receive inputs from the user, separately updating a plurality of visual characteristics of a plurality of different objects dependent on the stored state;

at least one automated processor configured to organize representations of the plurality of different objects having the plurality of visual characteristics according to an aesthetic algorithm and to update a rendering of the organized plurality of objects in response to each received response; and a communication port configured to receive the successively received inputs and to transmit the rendered organized plurality of different objects.

19. The system according to claim 18, wherein the at least one automated processor is configured to maintain three dimensional models for the plurality of different objects, and to update the rendering based on the three dimensional models.

20. The system according to claim 18, wherein the at least one automated processor is configured to issue an order to initiate manufacture the plurality of different objects according to the successively received inputs.

* * * * *